(12) United States Patent
Nakanishi

(10) Patent No.: US 6,479,136 B1
(45) Date of Patent: Nov. 12, 2002

(54) SUBSTRATE OF CIRCUIT BOARD

(75) Inventor: Motoyasu Nakanishi, Shizuoka (JP)

(73) Assignee: Suzuki Sogyo Co., Ltd., Shizuoka (JP)

( * ) Notice: Subject to any disclaimer, the term of this patent is extended or adjusted under 35 U.S.C. 154(b) by 0 days.

(21) Appl. No.: 09/831,048

(22) PCT Filed: Sep. 4, 2000

(86) PCT No.: PCT/JP00/05991

§ 371 (c)(1),
(2), (4) Date: May 3, 2001

(87) PCT Pub. No.: WO01/19145

PCT Pub. Date: Mar. 15, 2001

(30) Foreign Application Priority Data

| Sep. 6, 1999 | (JP) | ............................................. 11-252171 |
| Oct. 26, 1999 | (JP) | ............................................. 11-304199 |
| Jul. 14, 2000 | (JP) | ........................................ 2000-214963 |

(51) Int. Cl.$^7$ ............................................................. B32B 15/00
(52) U.S. Cl. ......................... 428/209; 174/258; 174/259
(58) Field of Search ........................ 428/209; 174/259, 174/258

(56) References Cited

U.S. PATENT DOCUMENTS

| 4,492,730 A | * | 1/1985 | Oishi et al. ................. 428/328 |
| 4,999,419 A | * | 3/1991 | Restaino ..................... 528/170 |
| 5,068,061 A | * | 11/1991 | Knobel et al. ............... 428/368 |
| 6,020,747 A | * | 2/2000 | Bahns et al. ................. 324/754 |

FOREIGN PATENT DOCUMENTS

| JP | 63-107092 | 5/1988 |
| JP | 63-287042 | 11/1988 |
| JP | 1-259595 | 10/1989 |
| JP | 5-48243 | 2/1993 |
| JP | 5-75225 | 3/1993 |
| JP | 6-128462 | 5/1994 |
| JP | 6-350212 | 12/1994 |
| JP | 6-350213 | 12/1994 |
| JP | 9-46011 | 2/1997 |
| JP | 9-153665 | 6/1997 |

* cited by examiner

*Primary Examiner*—Cathy Lam
(74) *Attorney, Agent, or Firm*—Wenderoth, Lind & Ponack, L.L.P.

(57) ABSTRACT

An object is to provide a metal-clad laminated board applicable for a printed wiring board capable of readily dissipating heat and superior in thermal conduction, and further, the printed wiring board substrate overlaid with a lead frame having the same characteristics as the metal-clad laminated board. To attain the aforesaid object, the printed wiring board of the invention has the carbon-base substrate overlaid with metal foil or lead frame through an insulating bonding layer. Thus, in a case of using the metal foil, the printed wiring board is formed in a metal-clad laminated board, and in a case of using the lead frame, the printed wiring board is formed in a lead frame laminated board.

12 Claims, 11 Drawing Sheets

SUBSTRATE OF CIRCUIT BOARD

TECHNICAL FIELD

This invention relates to a substrate for printed wiring boards. More particularly this invention relates to a metal-laminated board or substrate for wiring boards, which is overlaid with a lead frame. Still more particularly this invention relates to he aforesaid substrates made of carbonaceous material and having excellent heat conductivity.

BACKGROUND ART

Conventionally, a printed circuit board forming printed wiring thereon has been generally produced by use of photolithography, namely drawing a wiring pattern on the so-called metal-clad laminated board made by cover a substrate with metal foil such as copper foil by using photo resist and etching the desired wiring pattern thereon. The printed circuit boards thus produced have been used as wiring substrates for various electrical and electronic apparatuses. Forming of the printed circuit board using the substrate laminated with metal is suited to a microscopic processing for forming a very small wiring pattern with ease. Thus, this microscopic technique makes it possible to produce a printed circuit board having very small wiring. In general, a substrate made of synthetic resin such as phenol plastic has been widely used as the metal-clad laminated board, by way of example.

Further, in general wiring board substrates overlaid with the so-called lead frame punched out from a metal plate such as of copper have been applied to various electric and electronic apparatuses. The wiring board substrate overlaid with the aforesaid lead frame (hereinafter, simply referred to as "lead-frame laminated substrate) is inferior in productivity to a metal-clad electric wiring boards Thus, the lead-frame laminated substrate is inferior in fine machinability in forming wiring patterns, but easy to manufacture, so that the wiring board can be produced at a low cost. Besides, the lead frame made as thick as required for the purpose can advantageously withstand high electric current, consequently to produce the wiring board having low electrical resistance loss with ease. The lead-frame laminated substrate and the metal-clad electric wiring board are respectively used for each purpose, taking into consideration various conditions such as the merit, demerit and object required for the electric wiring board and various conditions required for electric or electronic apparatus to which the electric wiring board is applied. A lead-frame laminated substrate made from a plastic board such as of phenol plastic has been widely used so far.

In general, a circuit formed on the electric wiring board or lead-frame laminated substrate generates heat has danger of causing unexpected trouble due to intense heat accumulated, though varying with the type of the components for forming the circuit. Accordingly, the electric wiring board is required to release the heat quickly. However, both the electric wiring board made from the metal-clad laminated substrate of the conventional plastic board and the lead-frame laminated substrate using the conventional plastic board entail are disadvantageous in that they are inferior in heat conductivity, and therefore, cannot meet the demand for releasing the heat.

An object of the present invention is to provide a metal-clad laminated board having excellent heat conductivity so as to form a printed circuit board capable of releasing generated heat quickly and a lead-frame laminated substrate having excellent heat conductivity so that the heat generated can be released quickly.

DESCRIPTION OF THE INVENTION

The inventor of the invention completed this invention upon close and diligent investigation in order to attain the object described above. According to the invention, there is provided a metal-clad laminated substrate or lead-frame laminated board for forming a printed circuit board, which is produced by using a carbon-base substrate made of carbonaceous material having an excellent heat conductivity and an insulating bonding layer for steadily joining metal-foil or lead frame to the carbon-base substrate.

Namely, in order to attain the aforementioned object of the present invention, there is provided a metal-plated laminated board for a wiring board characterized in that the carbon-base substrate is overlaid with the metal foil or lead frame through an insulating bonding layer.

BEST MODE FOR CARRYING OUT THE INVENTION

Figure 1:
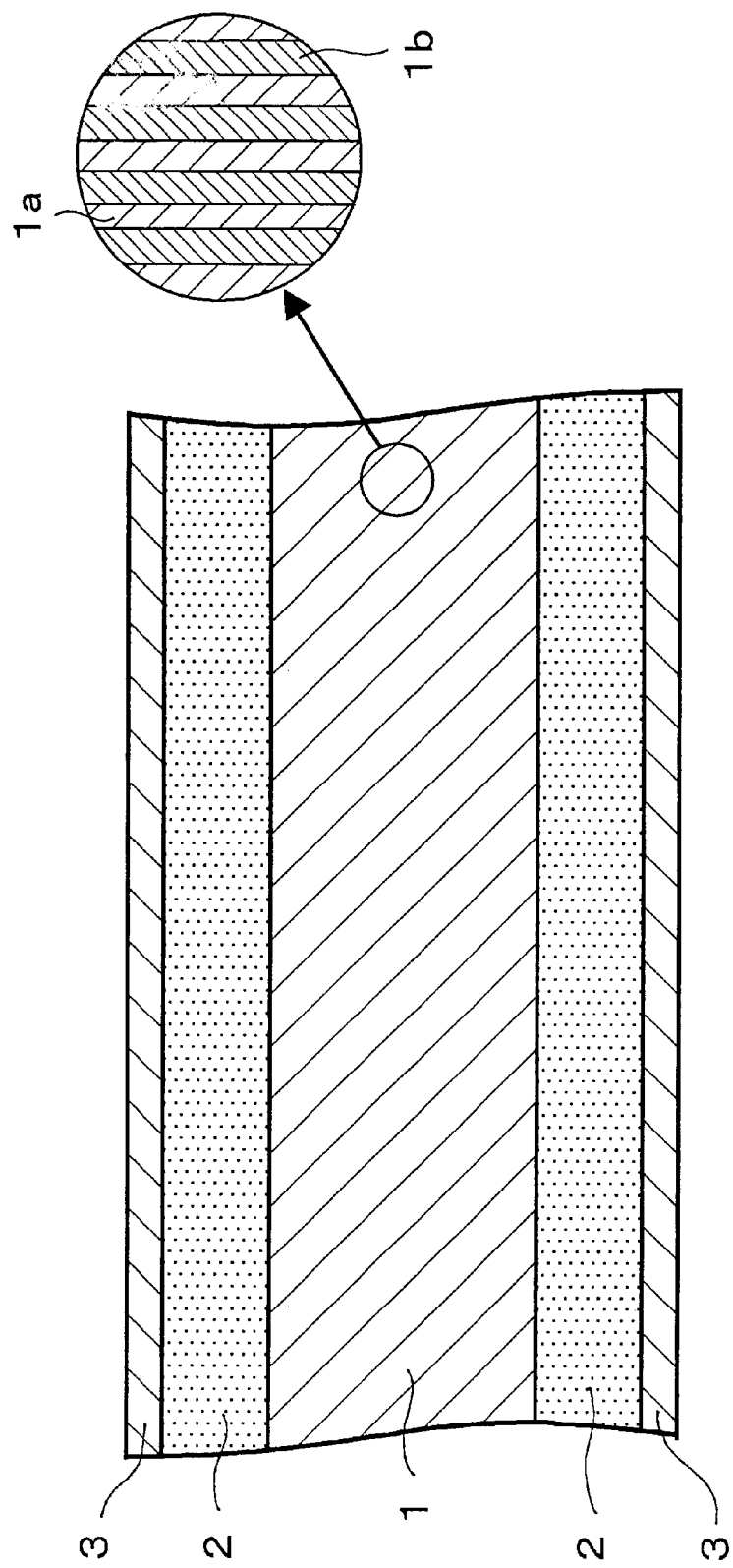
FIG. 1 is a diagrammatic section showing one example of a metal-clad laminated board of one embodiment of a printed circuit board according to the invention.

The substrate for wiring boards is made in a form of a metal-clad laminated board when overlaid with metal foil or a lead-frame laminated board when overlaid with a lead frame. The carbon-base substrate of the wiring substrate of the invention is generally made of a plate of carbonaceous material such as carbon fiber reinforced composite having carbon matrix of carbon fiber reinforcer or isotropy high density carbon material In a case that the carbon-base substrate is too thin, the strength thereof is decreased. In a case that the substrate is made thick, it becomes heavy and expensive. Therefore, the thickness of the substrate must be determined taking this conditions into consideration, but it is generally desirable to determine the thickness of the substrate on the order of 3 to 5 mm.

The carbon fiber reinforced composite used for the carbon-base substrate may be arbitrarily selected from various carbon fiber reinforced composites conventionally known. Generally, the carbon fiber reinforced composites are featured according to the orientation of carbon fibers, i.e. sorted into a first-order oriented type having the carbon fiber fabrics woven in one direction, a second-order oriented type having carbon fiber fabrics like a plain weave, diagonal weave or satin weave, a third-order oriented type having steric carbon fiber fabrics. There may also be used felt or short fiber fabrics. Various fabrics having any carbon fiber orientation may be arbitrarily applied to the present invention. The carbon fiber reinforced composite is generally produced by impregnating carbon fiber polymer having the carbon fiber orientation as noted above with thermosetting resin such as phenol resin or pitch matrix material such as of petroleum pitch to prepare pre-pregs, laminating the pre-pregs one on top of the other as required to make a matrix heating the matrix of laminated pre-pregs under pressure to harden the matrix, and baking the matrix at high temperature in inert atmosphere to carbonize the matrix. Generally, the carbon fiber reinforced composite formed of short fiber fabrics is produced by forming the matrix containing short carbon fibers in a desired shape, heating it under pressure, baking the matrix in inert atmosphere to carbonize the matrix. The carbon fiber reinforced composite for the carbon-base substrate may be produced by molding the matrix into a desired shape with desired thickness or cutting a carbon fiber matrix lump into the desired shape. The carbon fiber and carbon matrix for preparing various types of carbon fiber reinforced composites may be graphitized.

Of the carbon fiber reinforced composites described above, it is preferable to prepare a plate-like carbon matrix having carbon fibers oriented in its thickness direction, which is produced in such a manner that the carbon fiber reinforced composite having the first-order orientation of carbon fibers oriented in one direction is cut in the direction perpendicular to the orientation of the carbon fibers. The carbon fiber reinforced composite can desirably be used as the carbon-base substrate, since it excels in heat conductivity in the thickness direction. Cutting of the carbon fiber reinforced composite from the aforesaid carbon fiber matrix lump can be performed by using a conventionally known cutting device such as a wire saw and a rotary diamond saw.

Figure 2:
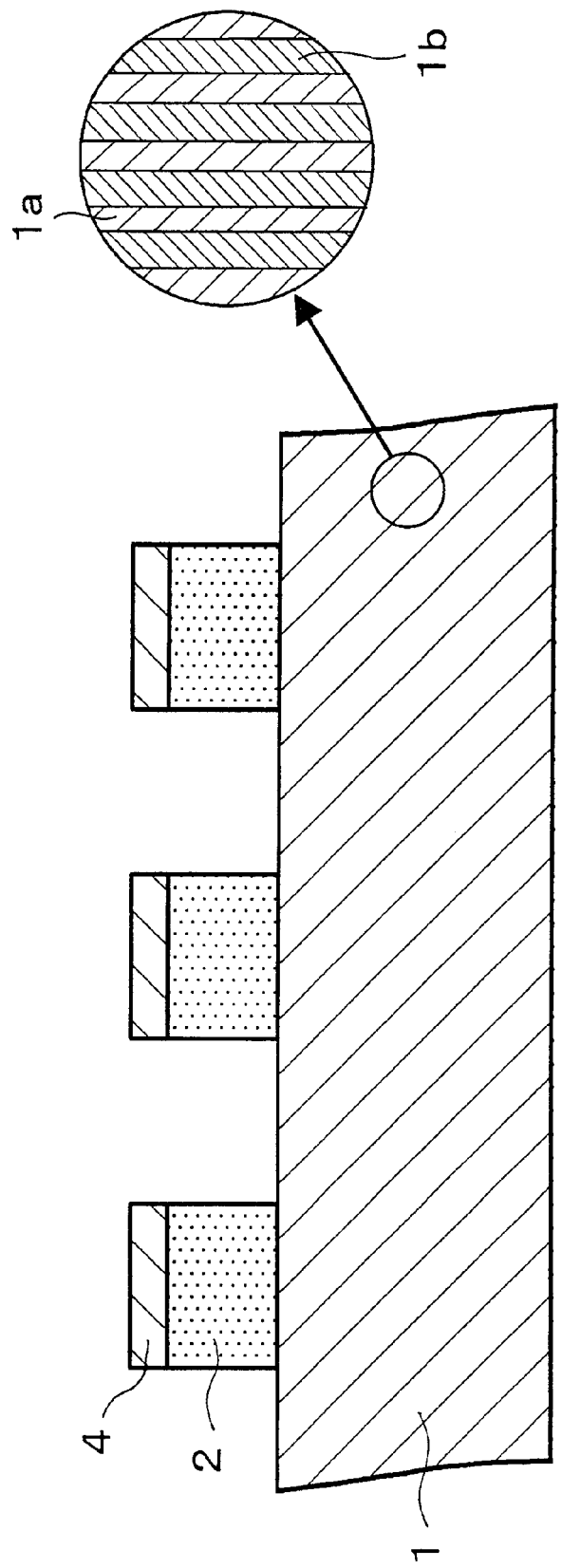
FIG. 2 is a diagrammatic section showing another example of a lead-frame laminated board of one embodiment of the printed circuit board according to the invention.
Figure 3:
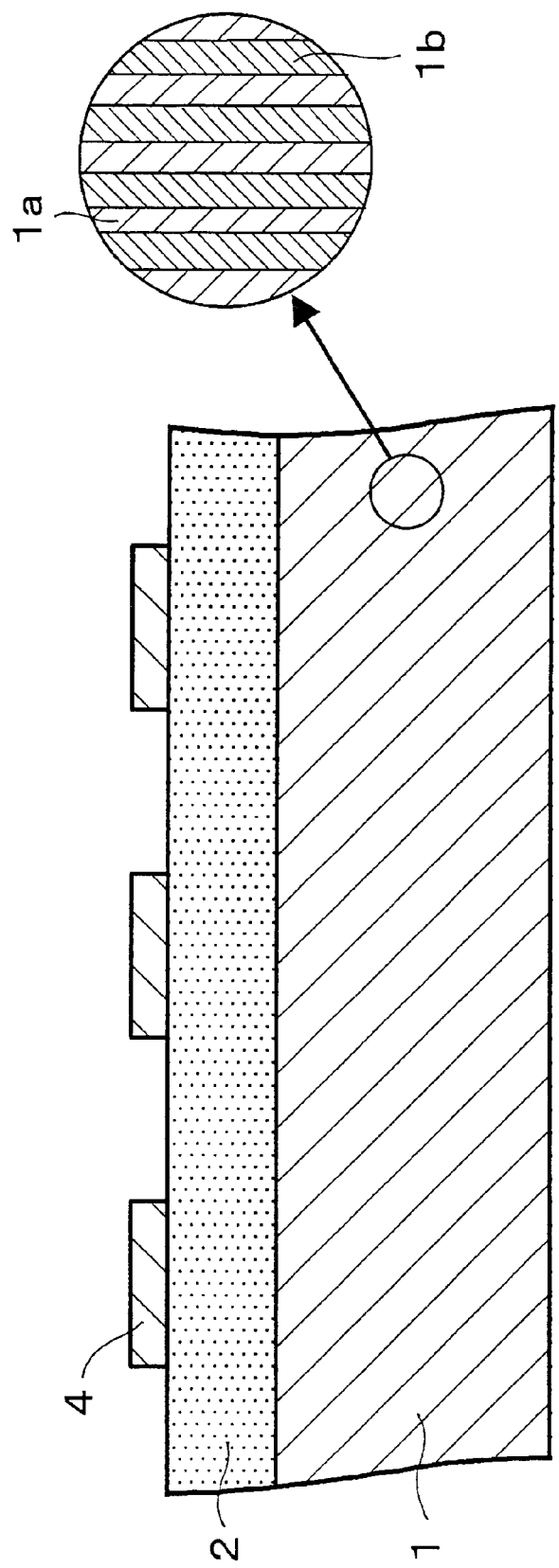
FIG. 3 is a diagrammatic section showing still another example of the lead-frame laminated board of one embodiment of a printed circuit board according to the invention.
Figure 4:
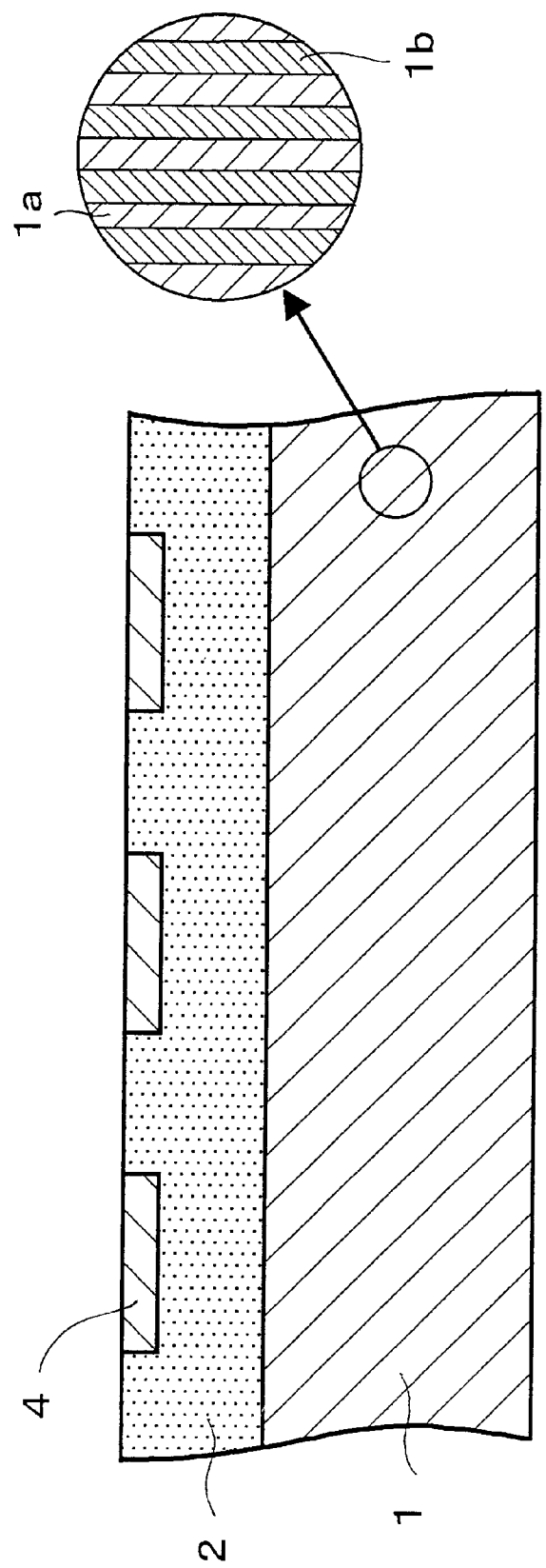
FIG. 4 is a diagrammatic section showing yet another example of the lead-frame laminated board of one embodiment of a printed circuit board according to the invention.

One embodiment of the metal-clad laminated board for the electric wiring board according to the present invention, in which the plate-like carbon fiber reinforced composite is used as the carbon-base substrate, is diagrammatically illustrated in FIG. 1. In the metal-clad laminated board in FIG. 1, insulating bonding layers 2 containing carbon fibers 1*b* oriented in the thickness direction of a carbon matrix 1*a*. The metal foil layer of the metal-clad laminated board may lie on both sides of the carbon-base substrate as shown in FIG. 1 or either side of the carbon-base substrate. One example of the plate-like carbon-base substrate having a lead-frame laminated board according to the present invention is diagrammatically illustrated in FIGS. 2 through 4. In the lead-frame laminated board in FIGS. 2 to 4, the carbon fibers 1*b* in the carbon matrix 1*a* are oriented in the thickness direction of the matrix, and insulating bonding layers 2 and lead frame layers 4 are placed on one of the surfaces of the carbon-base substrate 1. In the electric wiring board formed as the lead-frame laminated board according to the invention, the lead frame layers 4 may be placed on one of the surfaces of the carbon-base board 1 as shown in FIG. 2 to 4 or on both surfaces thereof. The insulating bonding layers 2 may be placed between each lead frame layer 4 and the carbon-base substrate 1 as shown in FIG. 2, or overlaid on the whole surface of the carbon-base substrate 1 as shown in FIG. 3. The lead frame layers 4 may be embedded in the surface portion of the insulating bonding layer 2 so as to make the surface of the entire board flat as shown in FIG. 4.

Also in the case of using isotropy high density carbon material as the aforesaid carbon-base substrate, it may be arbitrarily selected from a variety of isotropy high density carbon materials which have been generally known. The isotropy high density carbon material is generally produced by molding and sintering minute particles of sinterable graphite precursor such as of raw coke and mesocarbon micro beads under pressure or a mixture of minute graphite particles or carbon whisker powder and a binder of minute particles of graphite precursor. The isotropy high density carbon material for the carbon-base board may be formed in a plate shape or like a lump so as to be ultimately made flat by cutting. The aforesaid isotropy high density carbon materials may be graphitized.

The carbon fiber reinforced composite and isotropy high density carbon material having fine pores formed in the producing process therefore are porous. These porous materials are impregnated with inorganic coating agent or metal in order not to be porous, consequently to more increase their heat conductivity. Accordingly, the carbonaceous material as noted above may be used as the carbon-base substrate by being impregnated with the inorganic coating agent or metal to fill the fine pores in the carbon material. This treatment is desirable from the viewpoint of the heat conductivity of the substrate.

The inorganic coating agent with which the aforesaid carbonaceous material is impregnated may be selected from various liquid inorganic coating agents capable of saturating to the fine pores in the carbon-base substrate and solidifying after saturating into the carbon-base substrate, consequently to form a non-porous solid inorganic layer in the carbon-base substrate. By way of example, there may be used, as the coating agent, inorganic silicon-containing polymer from which a ceramic solid is derived by crosslinking reaction at room temperature or high temperature, cement such as alumina cement, and inorganic binder containing waterglass or the like. These inorganic coating agents may be diluted with an organic solvent in order to increase the impregnating ability thereof To be more specific, as the aforementioned inorganic coating agent, there may be generally used HEATLESS GLASS GA series (trade name of Homer Technology Co. Ltd.) which is silicon-containing polymer, Tonen Polysilazane (trade name of Tonen Petrochemical Co. Ltd.) which belongs to polysilazanes, Redproof MR-100 series (trade name of Heat System Research & Industry Inc.) which is an inorganic binder, and so on.

Infiltration of the inorganic coating agent into fine pores in the carbon-base substrate can be carried out by applying the inorganic coating agent to the carbon-base substrate with a brush, saturating the carbon-base substrate in the inorganic coating agent, forcibly injecting the inorganic coating agent into the carbon-base substrate under pressure, or causing the carbon-base substrate to be spontaneously impregnated with the inorganic coating agent in a vacuum, by way of example. As a result, the inorganic coating agent saturating into the carbon-base substrate solidifies. The solidifying condition of the inorganic coating agent varies with, for example, the sort or type of the inorganic coating agent. In a case of using HEATLES GLASS as the inorganic coating agent, it is desirable to heat it at about 130° C. for 60 minutes, in general.

As the aforementioned metal to saturating into the carbon-base substrate, there may be preferably used aluminum, copper or a mixture thereof. Infiltration of the metal into fine pores in the carbon-base substrate can be carried out by saturating molten metal such as aluminum and copper thereinto under high pressure. As the carbon-base substrate impregnated with aluminum, there are enumerated CC-MA (trade name of Sentan Zairyo, as which C/C composite base having carbon fibers oriented in first order is designated), and C-MA (trade name of Sentan Zairyo, as which isotropy high density carbon material is designated) and so on. As the carbon-base substrate impregnated with copper, there are enumerated MB-18 (trade name of Mebius AT, as which C/C composite base having carbon fibers oriented in first order is designated) and so on.

The metal foil applied to the metal-clad laminated board of the electric wiring board according to the invention may be selected from a variety of metal foil materials conventionally known as foil applicable for producing the metal-clad laminated board. In general, copper foil or nickel foil is preferably used for this purpose. The metal foil may be joined to one or both of the surfaces of the carbon-base substrate. The lead frame applied to the lead-frame laminated substrate of the electric wiring board of the invention may be selected from various types of lead frames conventionally known as the lead frame for producing elastic wiring boards, which are produced by punching out a desired wiring pattern or in other suitable methods. In general, a lead frame of copper or nickel is preferably used. The lead frame may be joined to one or both of the surfaces of the carbon-base substrate.

Next, the insulating bonding layer will be described The insulating bonding layer through which the aforementioned metal foil or lead frame is joined with the aforementioned carbon-base substrate is preferably made thin and excellent in insulating properties and bonding property so as to firmly unite the metal foil or lead frame to the carbon-base substrate. However, it is common knowledge that an ordinary adhesive agent is hard to merge into the carbon-base substrate and unlikely to produce sufficient bonding strength relative to the carbon-base substrate. To solve this problem, the insulating bonding layer in the present invention may be formed of (i) a structure of polyimide coating membrane on the carbon-base substrate and an bonding layer placed on the polyimide coating membrane, (ii) a structure of polyimide-vaporized polymer layer on the carbon-base substrate and an bonding layer placed on the polyimide-vaporized polymer layer, (iii) a structure in which a polyimide layer having bonding property is placed on the carbon-base substrate, (iv) a structure of a metal-clad layer on the carbon-base substrate and an bonding layer placed on the metal-clad layer, or (v) a structure of a primer layer on the carbon-base substrate and an bonding layer placed on the primer layer. With any of these structures for the insulating bonding layer, the carbon-base substrate in the invention can be firmly bonded to the metal foil or lead frame while ensuring sufficient insulating and bonding properties, so as to be put into practical use. That is, by previously forming a primary layer such as the aforementioned polyimide coat and polyimide-vapored polymer layer or selecting the polyimide layer having bonding property as the insulating bonding layer, the metal foil or lead frame can be strongly bonded to the carbon-base substrate with sufficient strength in practical application. In general, the insulating bonding layer is preferably made thin so as not to impede its heat conductivity in the perpendicular direction of the electric wiring board.

Figure 5:
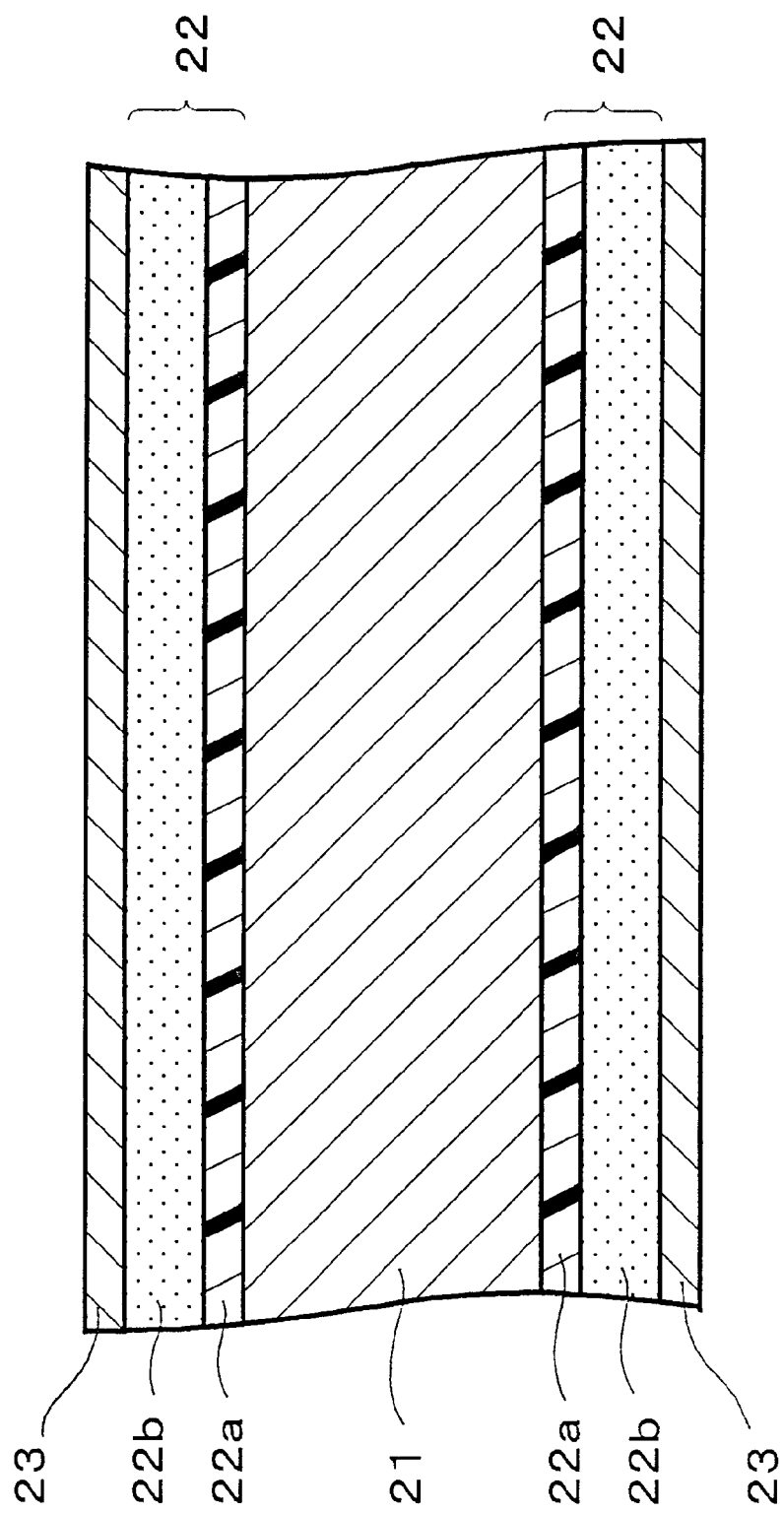
FIG. 5 is a diagrammatic section showing another example of the metal-clad laminated board of one embodiment of a printed circuit board according to the invention.

First, the item (i) describe above will be explained. The polyimide layer on the insulating bonding layer noted in the item (i) can be formed by, for example, applying any of various polyimide coating conventionally known to the carbon-base substrate. The polyimide coating may be prepared by dissolving either polyimide acid or polyimide resin in a solvent, but the latter can be practically used so that a coating having relatively excellent heat conductivity can be formed, since it has no need for a process of dehydrating by heating. By way of example, RIKACOAT (trade name of New Japan Chemical Co. Ltd) and UPIREX-S (trade name of Ube Industries, Ltd.) may be suitably used for this purpose. To the polyimide coating, various additives may be added in order to increase the insulating properties and stability of the coating. In the aforesaid manner, the polyimide coating formed on the carbon-base substrate is overlaid with the metal foil or lead frame through the agency of the bonding layer, and these layers are firmly bonded together by heating or under pressure at room temperature. As a result, the required electric wiring board integrally bonded with the metal foil or lead frame can be formed. The aforesaid bonding conditions may be determined according to the type of the polyimide coating. The embodiment of the metal-clad laminated board using the insulating bonding layer featured by the item (i) noted above is diagrammatically illustrated in FIG. 5 by way of example. In the embodiment of the metal-clad laminated substrate of FIG. 5, the both surfaces of the carbon-base substrate 21 are respectively coated with the insulating bonding layer 22 composed of the polyimide coating 22a and the bonding layer 22b and the metal foil layer 23 in order. Thus, the electric wiring board in the form of the metal-clad laminated board can be produced.

Figure 6:
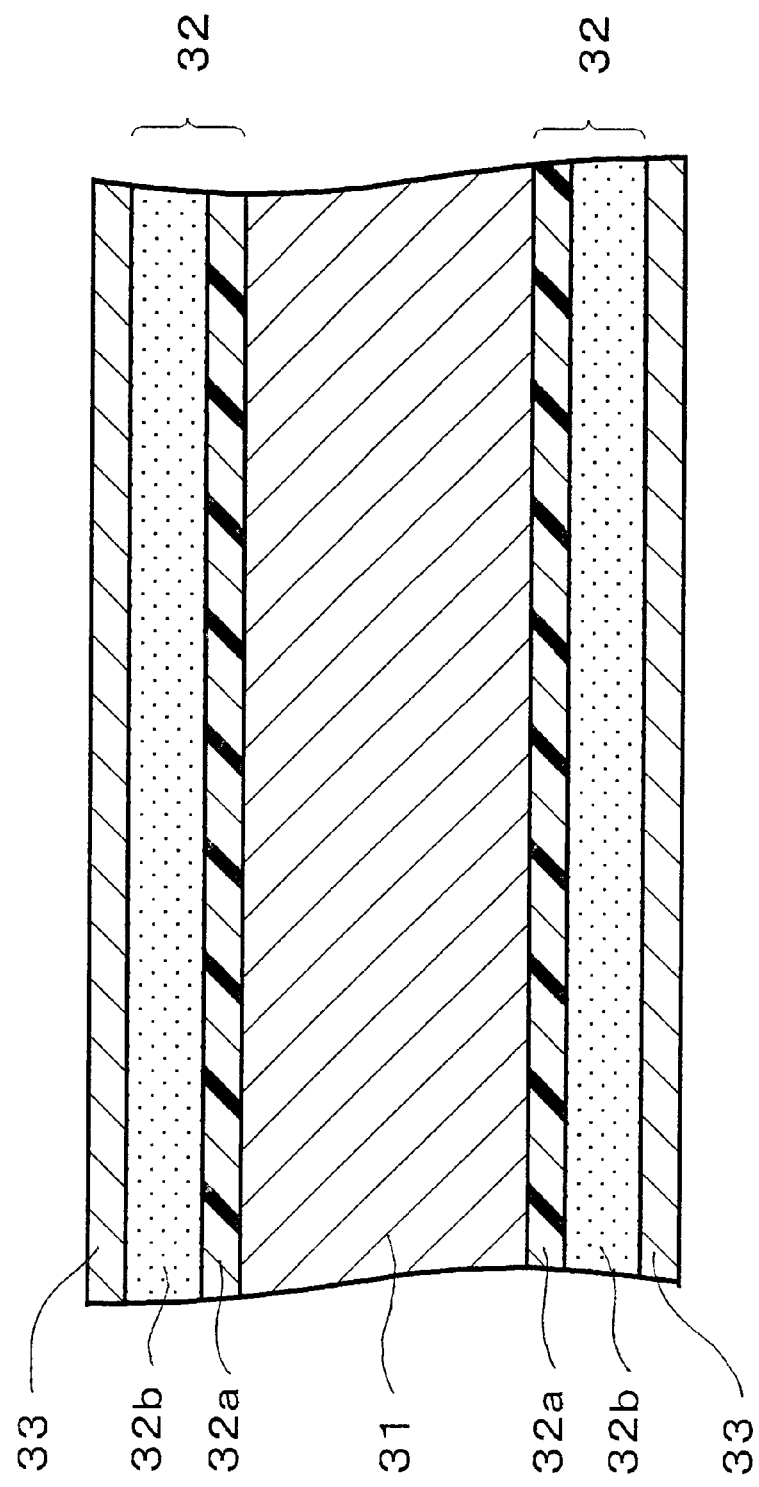
FIG. 6 is a diagrammatic section showing still another example of the metal-clad laminated board of one embodiment of a printed circuit board according to the invention.

As the polyimide coating membrane to be formed on the insulating bonding layer, electrode position polyimide coating may be suitably used. The electrode position polyimide coating membrane may be selected from various types of electrode position polyimide coatings, in which its resin component is polyimide and a medium is a cation solution. The electrode position polyimide coating membrane may contain any of various additives in order to improve its insulation property and stability. The electrode position polyimide coating membrane can be formed on the carbon-base substrate by an electrode position coating method. As the electrode position coating method to be applied to the invention, there have been so far known various methods. Onto the electrode position polyimide coating membrane formed by the electrode position coating method, the metal foil or lead frame is bonded through the bonding layer by heating or under pressure, so that the required electric wiring board having the carbon-base substrate firmly united with the metal foil or lead frame can be obtained. The aforementioned bonding conditions may be determined according to the type of the electrode position polyimide coating applied to the electric wiring board The embodiment of the metal-clad laminated board using the electrode position polyimide coating featured by the item (i) noted above is diagrammatically illustrated in FIG. 6 by way of example. In the embodiment of the metal-clad laminated board shown in FIG. 6, the both surfaces of the carbon-base substrate 31 are respectively coated with the insulating bonding layer 32 composed of the polyimide coating 32a and the bonding layer 32b and the metal foil layer 33 in order. Thus, the desired electric wiring board can be produced.

Figure 7:
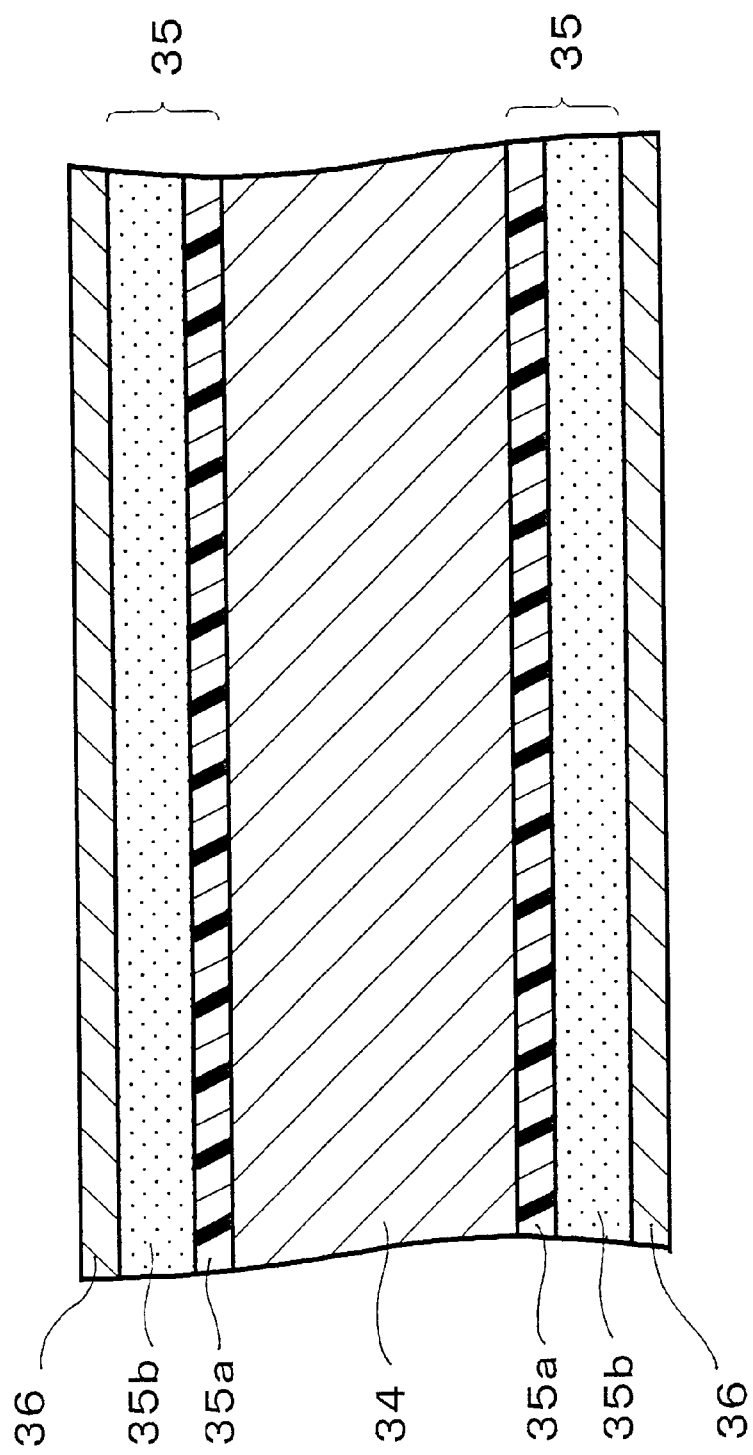
FIG. 7 is a diagrammatic section showing yet another example of the metal-clad laminated board of one embodiment of a printed circuit board according to the invention.

Next, the item (ii) described above will be explained. The polyimide-vaporized polymer layer on the insulating bonding layer noted in the item (i) can be formed by a known vaporization polymerizing method, for example. That is, an hydride such as pyromellitic dianhydnde, biphenyl tetracarboxylic dianhydride and benzophenone tetracarboxylic dianhydride and armatic diamine such as oxydiniline, paraphenylene diaiine and benzophenone diamine are vaporized together on the carbon-base substrate and heated to make an imide layer. The polyimide-vaporized polymer layer can easily be controlled in its thickness and formed in an exactly flat membrane. Thus, the carbon-base substrate and the metal foil or lead frame can be firmly united with sufficient insulating properties. The embodiment of the metal-clad laminated board using the insulating bonding layer featured by the item (ii) noted above is diagrammatically illustrated in FIG. 7 by way of example. In the embodiment of the metal-clad laminated board shown in FIG. 7, the both surfaces of the carbon-base substrate 34 are respectively coated with the insulating bonding layer 35 composed of the polyimide-vaporized polymer layer 35a and the bonding layer 35b and the metal foil layer 35 in order. Thus, the desired elastic wiring board can be produced.

Figure 8:
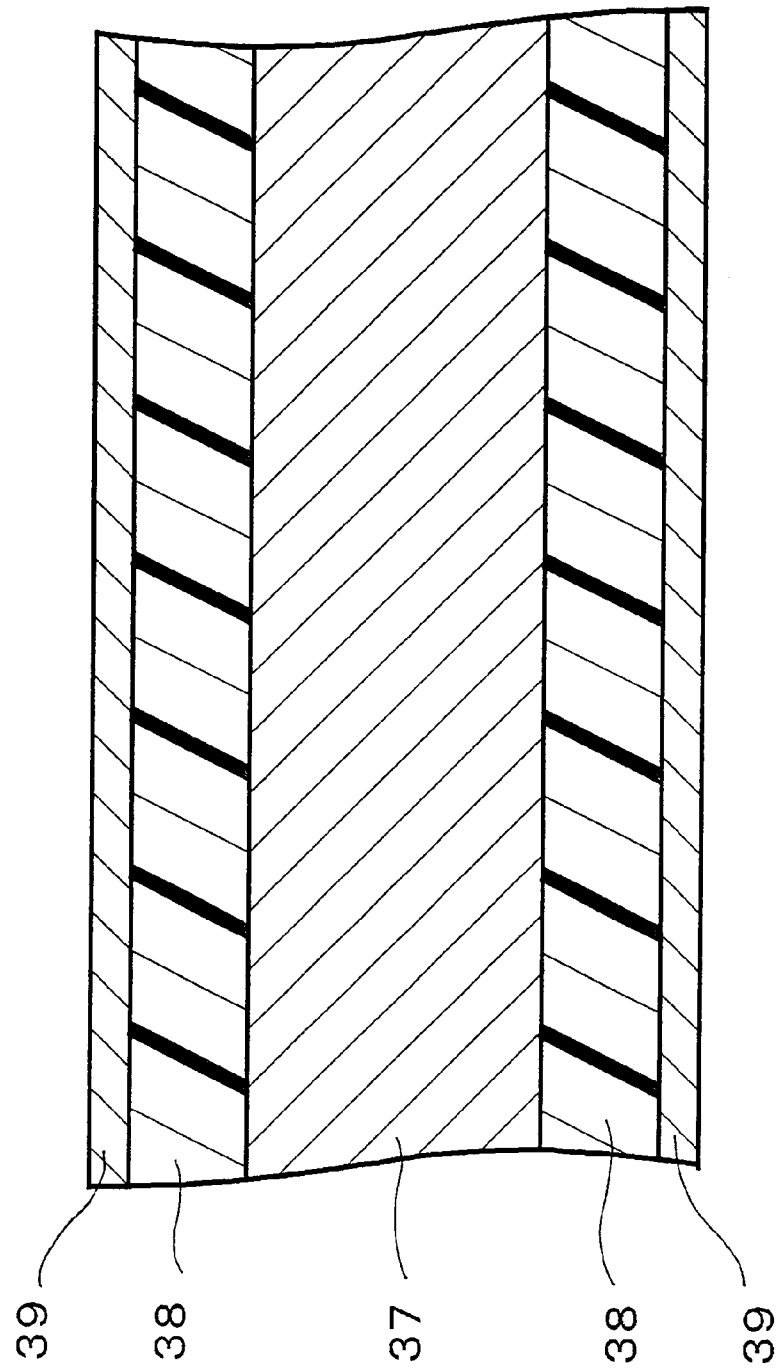
FIG. 8 is a diagrammatic section showing further example of the metal-clad laminated board of one embodiment of a printed circuit board according to the invention.

Next, the item (iii) described above will be explained. The process for making the insulating bonding layer having a multi-layer construction constituted by the polyimide coating layer or polyimide-vaporized polymer layer as touched upon above in connection with the items (i) and (ii) noted above is complicated, but desirable in order to conserve the sufficient bonding strength. However, the process of the item (iii) becomes relatively simple. The polyimide in this process serves as the bonding layer in the items (i) and (ii). The polyimide layer having such a bonding function may be selected from a known polyimide bonding agent such as UPITITE (trade name of Ube Industries, Ltd) and KAPTON (trade name of DuPont-Toray Co. Ltd.). Thus, the required electric wiring board with the polyimide layer having the aforementioned bonding property can be produced by bonding the metal foil or lead frame onto the carbon-base substrate in accordance with the type of the polyimide bonding agent applied thereto (which type is determined with the thermosetting property, thermal plasticity of the polyimide bonding agent, and form such as of a film type or a solution type). In a case of using the film type thermoplastic polyimide bonding agent, the film type bonding agent is placed between the metal foil or lead frame and the carbon-base substrate and then heated under pressure, thereby to firmly unite the metal foil or lead frame and the carbon-base substrate. The embodiment of the metal-clad laminated board using the insulating bonding layer featured by the item (iii) noted above is diagrammatically illustrated in FIG. 8 by way of example. In the embodiment of the metal-clad laminated board shown in FIG. 8, the both surfaces of the carbon-base substrate 37 are respectively coated with the polyimide layer 38 having the bonding property and the insulating bonding or metal foil layer 39 in order. Thus, the desired electric wiring board can be produced The polyimide bonding agent noted in the item (iii) above may be overlaid on the polyimide coating membrane noted in the item (i) above or the polyimide-vaporized polymer layer noted in the item (ii) above. That is, upon forming the polyimide coating membrane (including the electrode position polyimide coating membrane) or polyimide-vaporized polymer layer on the carbon-base substrate, the metal fail or lead frame is placed on the polyimide coating membrane or polyimide-vaporized polymer layer through the polyimide bonding agent noted in the item (iii). Thus, the desired electric wiring board can be produced.

In a case of using the film type thermoplastic polyimide bonding agent as the bonding layer to be laid on the polyimide coating membrane on the carbon-base substrate, the coating component of the polyimide coating membrane soaks into the pores in the surface of the carbon-base substrate, thereby to plug up the pores in the process of bonding the metal foil or lead frame to the carbon-base substrate under pressure. As a result, the heat conductivity of the wiring board can be increased, and the insulating properties can be ensured owing to the film type thermoplastic polyimide bonding agent by which the carbon-base substrate is securely isolated from the metal foil or lead frame.

Figure 9:
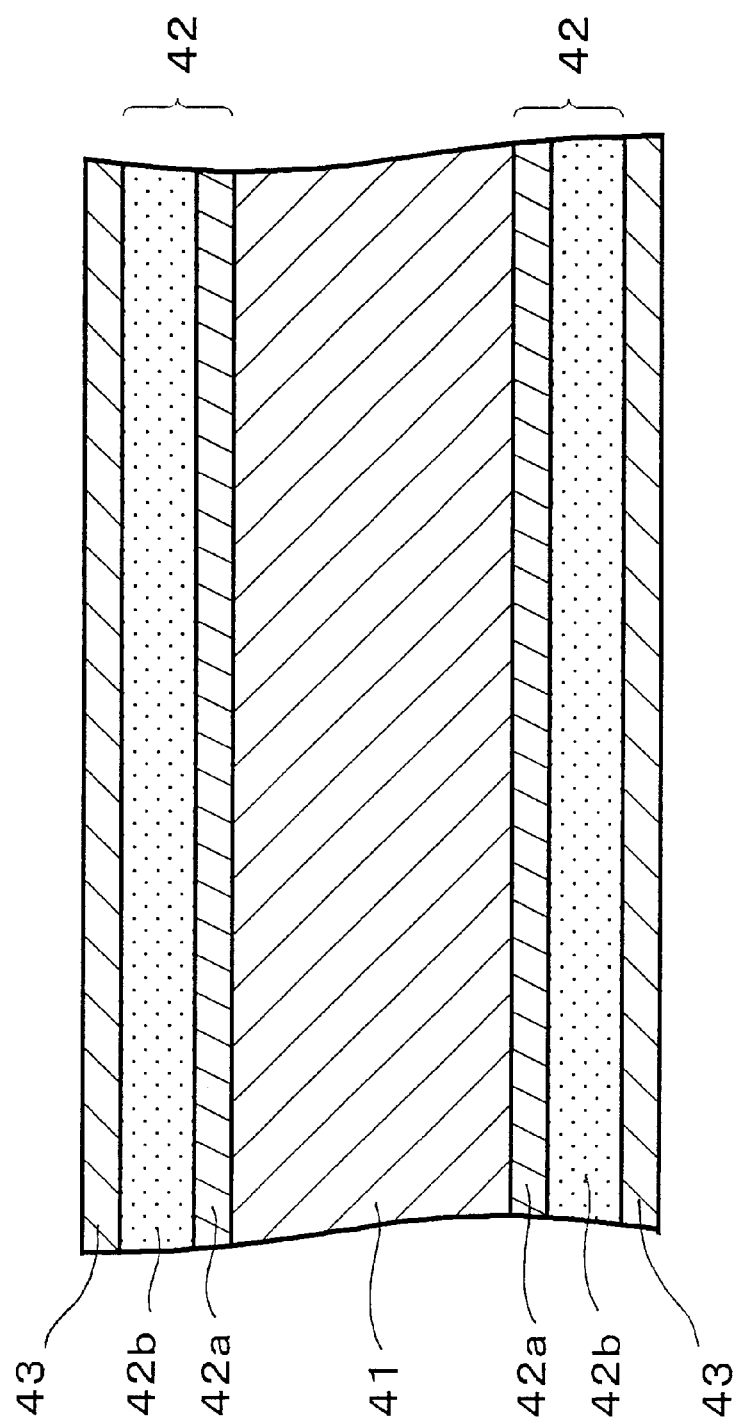
FIG. 9 is a diagrammatic section showing the other example of the metal-clad laminated board of one embodiment of a printed circuit board according to the invention.

Next, the item (iv) described above will be explained. The insulating bonding layer in the term (iv) is plated with metal by an electroless plating or electric plating method well-known conventionally. As the metal to be plated on the insulating bonding layer, there may be used copper, nickel and so on. The metal plating layer is overlaid with the metal foil or lead frame through the bonding layer. Then, a laminated board thus obtained is heated or pressed at room temperature. Thus, the required elect wiring board in which the metal foil or lead frame is firmly united with the carbon-base substrate can be produced. Incidentally, the bonding layer on the metal plating layer necessitates insulating properties. The metal plating layer in the term (iv) functions as a primer and satisfactorily meet the requirements for the bonding ability for the carbon-base substrate. The embodiment of the metal-clad laminated board using the insulating bonding layer featured by the item (iv) noted above is diagrammatically illustrated in FIG. 9 by way of example. In the embodiment of the metal-clad laminated board shown in FIG. 9, the both surfaces of the carbon-base substrate 41 are respectively coated with the polyimide layer 42 formed of the metal plating layer 42a and the bonding layer 42b and the metal foil layer 43 in order. Thus, the required electric wiring board can be produced.

As the bonding agent used in the embodiments of the terms (i), (ii) and (iv), there may be suitably used epoxy resin adhesive, silicon adhesive and the like, other than the aforementioned polyimide bonding agent. As the silicon adhesive, there may be used, for instance, KE1800T (trade name of Shin-Etsu Silicones Co. Ltd.) and TES-3260 (trade name of GE Tbshiba Silicones Co. Ltd.) Also, the inorganic coating agent such as HEATLESS GLASS GA touched upon above may be used as the bonding agent as noted above. The bonding agent is applied to the polyimide coating membrane, polyimide-vaporized polymer layer or metal plating layer hereinafter, referred to as an "undercoat"), thereby to form the bonding layer. The bonding agent may be applied to the undercoat by a conventionally known coating method. The formation of the bonding layer on the undercoat may be performed by (a) applying the bonding agent onto the undercoat laid on the carbon-base substrate and placing the metal foil or lead frame on the bonding agent, (b) first applying the bonding agent to one surface of the metal foil or lead frame and then placing the metal foil or lead frame on the undercoat laid on the carbon-base substrate with the bonding layer of the bonding agent coming into contact with the undercoat, (c) applying the bonding agent to both the undercoat on the carbon-base substrate and one surface of the metal foil or lead frame, and uniting together the carbon-base substrate and the metal foil or lead frame with the bonding agent layers on the carbon-base substrate and the metal foil or lead frame coming into contact with each other, or (d) laminating the film-like bonding agent in its incomplete hardened state and the metal foil or lead frame on the undercoat of the carbon-base substrate. In placing the metal foil or lead frame on the carbon-base substrate, it is desirable to press these layers by using a roll press, platen press or the like in order to closely unite the layers without remaining air in between the layers. In bonding the layers, a primer as described in detail later may optionally be applied to the undercoat and the metal foil or lead frame with a brush.

The drying or heating condition of the aforementioned bonding agent may be arbitrarily determined in accordance with the type of the bonding agent applied. In a case of using TES-3260 (trade name of GE Toshiba Silicones Co. Ltd.) as the bonding agent, it is preferable to heat it at 150° C. for 60 minutes under pressure.

Figure 10:
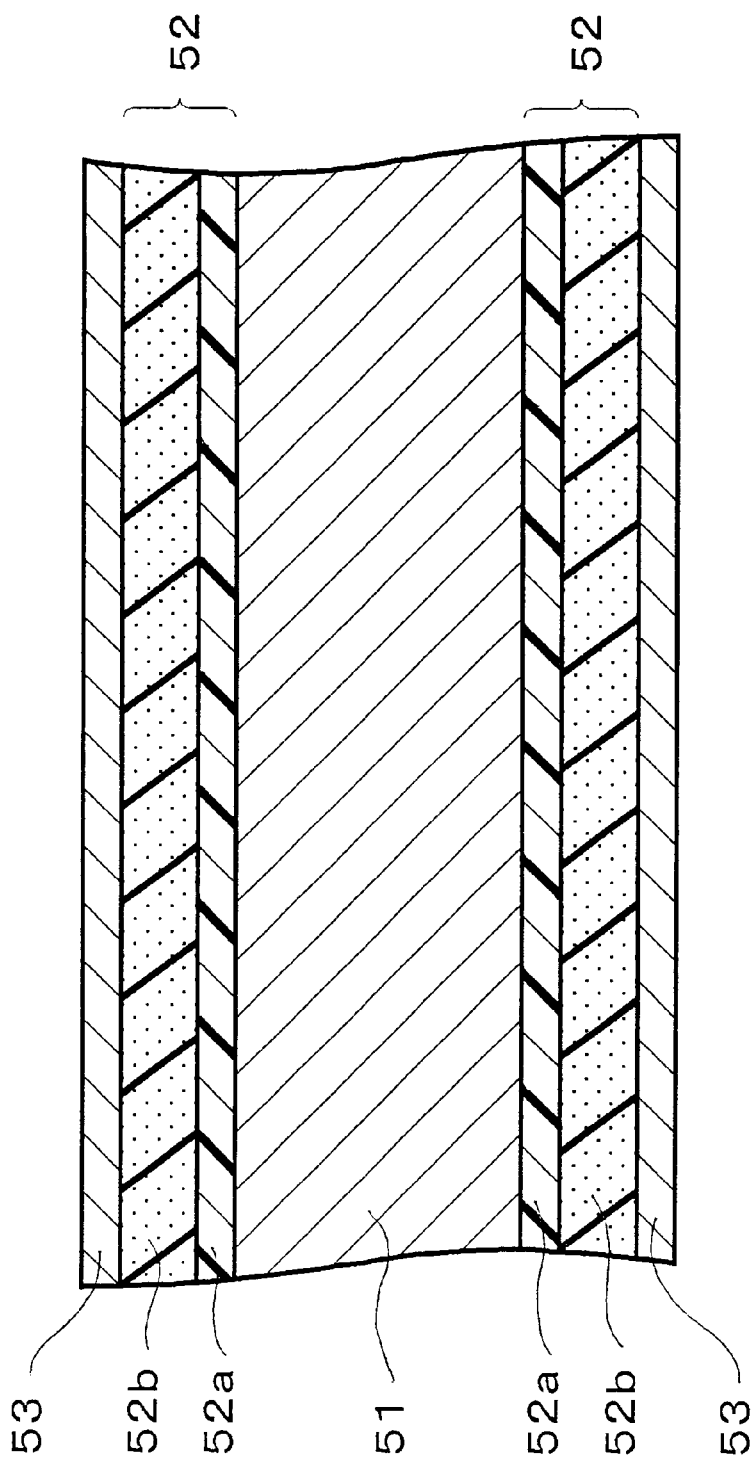
FIG. 10 is a diagrammatic section showing the other example of the metal-clad laminated board of one embodiment of a printed circuit board according to the invention.

Next, the item (v) described above will be explained In forming the insulating bonding layer in the term (v), there may be used, as a primer for forming a primer layer, PRIMER-A (trade name), PRIMER-X (trade name) and PRIMER-Y (trade name), which are put on the market by Dow-Corning Toray Silicone Co. Ltd. To be concrete, as the elastomer bonding layer applied to the primer layer, which requires insulating properties, there may be suitably used SOTEFA-70 (trade name as which silicone elastomer bonding agent is called) of Dow-Corning Toray Silicone Co. Ltd. Incidentally, this elastomer bonding agent may be used as the bonding agent formed on the insulating bonding agent in the aforementioned items (i), (ii) and (iv). This elastomer bonding agent may contain a granulated heat conductive filler such as SiN, SiC and $Al_2O_3$, according to demand. The aforesaid heat conductive filler may be added to the bonding layer in the insulating bonding layer of the items (i), (ii) and (iv) described above and the polyimide layer having bonding ability in the item (iii) described above. The elastomer bonding layer laid on the primer layer is dried or hardened by heat, thereby to firmly unite the metal foil or lead frame onto the carbon-base substrate. As a result, the required electric wiring board can be produced. The processing conditions for drying or hardening the elastomer bonding layer by heat are determined in accordance with the type of the elastomer bonding agent applied thereto. The embodiment of the metal-clad laminated board using the insulating bonding layer featured by the item (v) noted above is diagrammatically illustrated in FIG. 10 by way of example. In the embodiment of the metal-clad laminated board shown in FIG. 10, the both surfaces of the carbon-base substrate 51 are respectively coated with the insulating bonding layer 52 constituted by the primer layer 52a and the bonding layer 52b and the metal foil layer 53 in order. Thus, the required electric wiring board can be produced.

In forming the insulating bonding layer noted in the items (i) to (v), the bonding layer in the items (i), (ii), (iv) and (v) and the polyimide layer having the bonding ability in the item (iii) may contain proper amounts of the granulated filler serving as a spacer. As the aforesaid filler serving as the spacer, there may be used, for example, silica, spherical alumina and hollow balloons.

Figure 11:
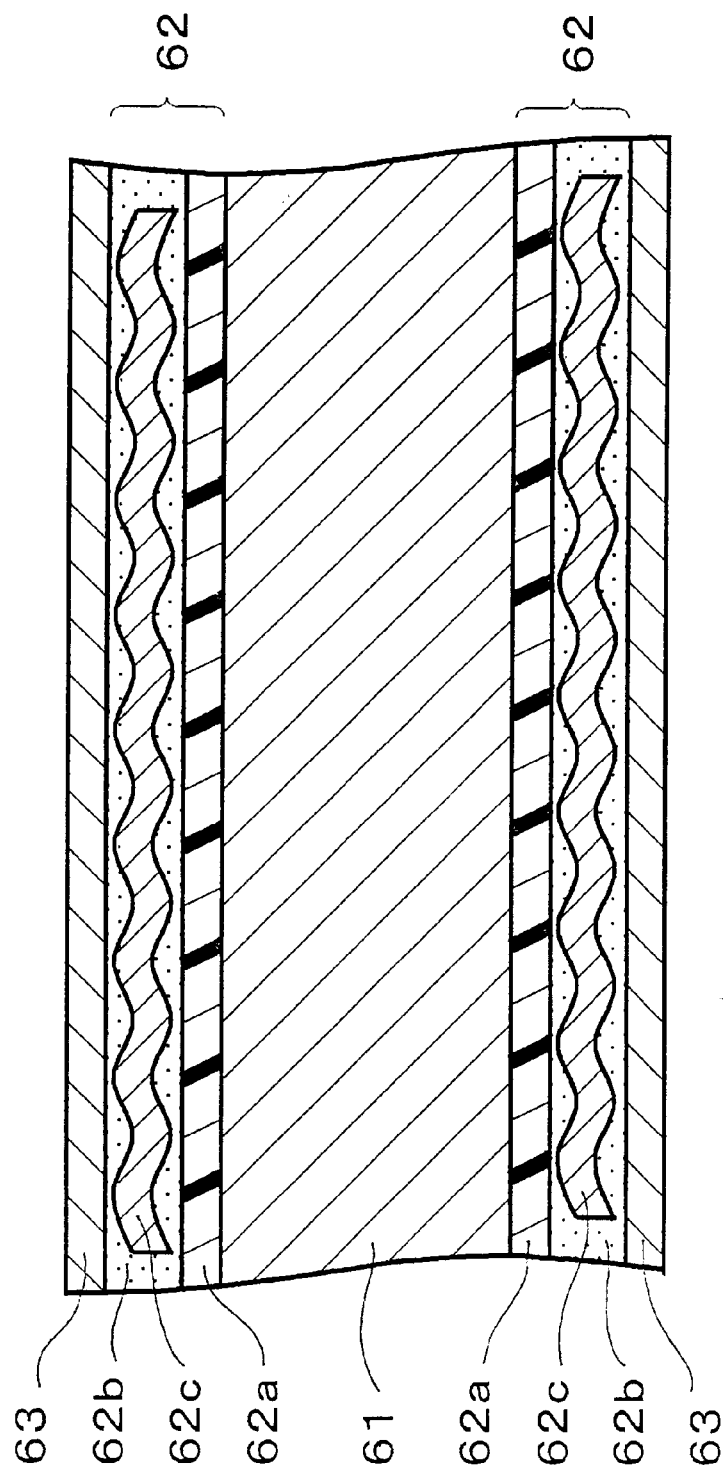
FIG. 11 is a diagrammatic section showing the other example of the metal-clad laminated board of one embodiment of a printed circuit board according to the invention.

In the process of forming the insulating bonding layer noted in the item (i) to (v), insulating woven or nonwoven fabric may be embedded in the bonding layer noted in the items (i), (ii), (iv) and (v) and the polyimide layer serving as the bonding agent noted in the item (iii) according to demand. This construction is illustrated in FIG. 11. In the metal-clad laminated board of FIG. 11, the insulating bonding layer 62 comprising the undercoat 62a such as of the polyimide coating membrane and the bonding layer 62b enclosing the nonwoven fabric 62c and the metal foil 63 are bonded to the both surfaces of the carbon-base substrate 61. Thus, the woven or nonwoven fabric embedded in the bonding layer serves as a spacer to sufficiently separate the carbon-base substrate from the metal foil or lead frame, consequently to improve the insulation breakdown properties of the electric wiring board by the thickness of the woven or nonwoven fabric.

As the woven or nonwoven fabric as described above, there may be selectively used electrical insulating and heat-resistant fabric such as fabric of synthetic fiber, natural fiber, glass fiber and so on. To be concrete, there may be suitably used nonwoven fabric of aramid fiber such as META-ARAMID PAPER (trade name of DuPont Teijin Advanced Papers Ltd.) When the woven or nonwoven fabric applied therefore is too thick, the heat conductivity of the electric wiring board is degraded, and inversely, when it is too thin, the elastic insulation between the metal foil or lead frame and the carbon-base substrate cannot be secured. Accordingly, the thickness of the fabric should be determined taking these circumstances into account. To be concrete, it is appropriate to determine the thickness of the fabric in the order of 30 to 150 $\mu$m, but this should not be understood as being limited thereto.

Formation of the insulating bonding layer from the undercoat of the polyimide coating membrane and the bonding layer is filed in order to produce the electric wiring board containing the woven or nonwoven fabric by the following steps. Namely, the insulating bonding layer is formed by the steps of (a) forming the undercoat such as the polyimide coating membrane on the carbon-base substrate, (b) laying the woven or nonwoven fabric impregnated with the bonding agent by applying the bonding agent to the fabric or immersing the fabric in the bonding agent, (c) laying the metal foil or lead frame thereon. Thus, the required electric wiring board can be produced. As another method, the bonding agent is applied to the undercoat in the aforementioned step (b), and then, the woven or nonwoven fabric is laid thereon and coated with the bonding layer. In this case, it is required to apply a sufficient amount of bonding agent onto the woven or nonwoven fabric so as to embed the fabric in the bonding agent layer (i.e. so as not to expose the fabric), taking shrinkage of the hardened bonding agent into consideration. Further, the insulating bonding layer formed of the polyamide layer serving as the bonding agent can be formed on the electric wiring board in the same manner as the steps (a) to (c) except for the process of forming the undercoat on the carbon-base substrate. In a case of using the film type thermoplastic polyimide bonding agent, the electric wiring board may be produced by placing the woven or nonwoven fabric between the two film type polyimide bonding agents, laying the metal foil or lead frame thereon, and then, melting and hardening the bonding agent. It is a matter of course that the woven or nonwoven fabric at that time requires high heat resistance to endure heat at a temperature higher than the melting temperature of the film type bonding agent. Incidentally, in placing the metal foil or lead frame on the carbon-base substrate, it is desirable to press these layers by using a roll press, platen press or the like in order to closely unite the layers without remaining air in between the layers.

The aforesaid metal-clad laminated board in the electric wiring board according to the invention may be produced by a common method such as a conventionally known photolithography technology, thereby to suitably form the electric wiring board having a printed wiring pattern as required. The electric wiring board thus obtained is applicable for various purposes in electric or electronic apparatuses. When the lead frame laminated board is demanded, it can be suitably used as it is for the electric or electronic apparatuses. The electric wiring board according to the present invention is excellent in heat conductivity and heat radiating property. Thus, the printed wiring board derived from the metal-clad laminated electric wiring board or the lead frame type laminated electric wiring board according to the present invention can be specifically applied for an electric circuit such as of electric or electronic apparatus which generates heat in operation.

Although the embodiments of the present invention will be described in detail hereinafter in comparison with comparative examples, the invention is by no means limited thereto.

Embodiment 1

A CC (trade name of Sentan Zairyo) of a carbon fiber reinforced composite (hereinafter, referred to as "C/C composite") of 3 mm thickness, in which carbon fibers are oriented in the thickness direction of a carbon matrix, was used as the carbon-base substrate. The plate-like C/C composite is coated on its one surface with electrode position polyimide coating by an electrode position coating method on 30 volts for 2.5 minutes at room temperature, dried at 80° C. for 10 minutes, and then, baked at 250° C. for 30 minutes. Consequently, the wiring board with the electrode position polyimide coating layer was formed on the carbon-base substrate. Further, a copper foil coated with silicone bonding agent—KE1800T (trade name of Shin-Etsu Silicones Co. Ltd.)—was laid on the aforesaid electrode position polyimide coating layer so as to bring the bonding agent coated surface into contact with aforesaid electrode position polyimide coating layer. Prior to the application of the bonding agent to the carbon-base substrate, PRIMER-A (trade name of Dow-Corning Toray Silicone Co. Ltd.) was preliminarily applied to the surface of the copper foil with a brush in a primer applying process. Subsequently, the laminated board thus obtained was pressed at $294N/cm^2$ for 3 minutes by a heat press to remove air and surplus bonding agent, and then, after releasing the pressure exerted thereon, subjected to heating treatment at 120° C. for 60 minutes to harden the bonding agent. Thus, the copper-clad laminated board was prepared. The thickness of the electrodeposition polyimide coating membrane of the copper-clad laminated board was 20 $\mu$m, and the thickness of the bonding agent layer was 100 $\mu$m, adding up to 3.19 mm in whole thickness.

Embodiment 2

A polyimide coating membrane was laid on one surface of a plate-like C/C composite having 3 mm thickness same as that used in Embodiment 1 noted above by applying polyimide coating material of RIKACOAT PN-20 (trade name of New Japan Chemical Co. Ltd.) with a brush. The polyimide coating membrane was overlaid with a copper foil of 70 $\mu$m thickness coated with silicone bonding agent, i.e. KE1800T (trade name of Sbin-Etsu Silicones Co. Ltd.) so as to bring the bonding coating surface into contact with the afore noted polyimide coating membrane. Before applying the polyimide coating membrane and bonding agent, PRIMER-A (trade name of Dow-Corning Toray Silicone Co. Ltd.) was preliminarily applied to the copper foil with a brush in a primer applying process. Subsequently, the laminated board thus obtained was pressed at $294N/cm^2$ for 3 minutes by a heat press to remove air and surplus bonding agent, and then, after releasing the pressure exerted thereon, subjected to heating treatment at 120° C. for 60 minutes to harden the bonding agent. Thus, the copper-clad laminated board was prepared. The thickness of the electrodeposition polyimide coating membrane of the copper-clad laminated board was 20 $\mu$m, and the thickness of the bonding agent layer was 100 $\mu$m.

Embodiment 3

A polyimide coating membrane was laid on one surface of a plate-like C/C composite having 3 mm thickness same as that used in Embodiment 1 noted above by plating the both surfaces of the plate-like C/C composite with nickel by an electroless plating method and placing, on the nickel-clad layer, a copper foil of 70 $\mu$m thickness coated with silicone bonding agent, i.e. KE1800T (trade name of Shin-Etsu Silicones Co. Ltd.) so as to bring the bonding coating surface into contact with the afore noted polyimide coating membrane. Before forming the nickel-dad layer and bonding agent, PRIMER-A (trade name of Dow-Corning Toray Silicone Co. Ltd.) was preliminarily applied to the copper foil with a brush in a primer applying process. Subsequently, the laminated board thus obtained was pressed at $294N/cm^2$ for 3 minutes by a heat press to remove air and surplus bonding agent, and then, after releasing the pressure exerted thereon, subjected to heating treatment at 120° C. for 60 minutes to harden the bonding agent. Thus, the copper-clad laminated board was prepared. The thickness of the nickel-clad layer of the copper-clad laminated board was 20 $\mu$m, and the thickness of the bonding agent layer was 100 $\mu$m.

Embodiment 4

Onto one surface of a plate-like C/C composite having 3 mm thickness same as that used in Embodiment 1 noted above, PRIMER-X (trade name of Dow-Corning Toray Silicone Co. Ltd ) was applied with a brush and dried at room temperature, to form a primer layer. On the primer layer, a film-like silicone elastomer bonding agent, SOTEFA-70 (trade name of Dow-Corning Toray Silicone Co. Ltd.), and a copper foil of 70 $\mu$m thickness were overlaid in order. The laminate board thus obtained was pressed at $294N/cm^2$ by a heat press and subjected to heating treatment at 130° C. for 30 minutes to harden the bonding agent, consequently to prepare the copper-clad laminated board. The thickness of the primer layer on the copper-clad laminated board was 1 $\mu$m, and the thickness of the bonding agent layer was 100 $\mu$m.

Embodiment 5

A plate-like C/C composite having 3 mm thickness same as that used in Embodiment 1 noted above was dipped in silicon-containing polymer, i.e. HEATLESS GLASS GA-4 (N) (trade name of Homer Technology Co. Ltd) at reduced pressure of 70 mmHg to permit the HEATLESS GLASS to plug fine pores in the aforesaid plate-like C/C composite, and thereafter, allowed to stand for 50 minutes at room temperature. Subsequently, it was heated at 120° C. for 60 minutes to harden the HEATLESS GLASS. Consequently, the plate-like C/C composite impregnated with HEATLESS GLASS was prepared. Thus, the copper-clad laminated board was obtained in the same way as that of Embodiment 1, except that the plate-like C/C composite impregnated with HEATLESS GLASS was used as the carbon-base substrate in this embodiment.

Embodiment 6

As the carbon-base substrate, MB-18 (trade name of Mebius AT, as which C/C composite base having carbon fibers oriented in first order is designated) was used instead of the plate-like C/C composite used in Embodiment 1 and treated to prepare a copper-clad laminated board in the same way as that in Embodiment 1. The thickness of the electrodeposition polyimide coating membrane in the copper-clad laminated board was 100 μm, and the total thickness of the board was 3.19 mm. Thereafter, the copper-clad laminated board was etched to remove the copper foil therefrom. The laminated board (3.12 mm in thickness) thus obtained is placed on an aluminum plate (25 mm in thickness) and measured in its heat conductivity by using a heat conduction meter QTM-500 (made by Kyoto Electronics Co. Ltd.). Because measurement of heat conduction requires a some degree of thickness of a measuring object, the aluminum plate was supplementarily used in this measurement. On measurement, the thickness thereof was 22.64 (W/m·K).

Comparative Example 1

As a comparative sample, a printed circuit board No. 31 (1.6 mm in thickness) produced by Sunhayato Corporation was used. This printed circuit board is formed by coating the both surfaces of an epoxy/glass board with copper foils.

The printed circuit board was etched to remove the copper foil from the surface thereof to obtain an epoxy/glass substrate. The epoxy/glass substrate thus obtained is placed on an aluminum plate (25 mm in thickness) and measured in its heat conductivity by using a heat conduction meter QTM-500 (made by Kyoto Electronics Co. Ltd.). Because measurement of heat conduction requires a some degree of thickness of a measuring object, the aluminum plate was supplementarily used in this measurement in the same manner as Embodiment 6 noted above. On measurement, the thickness thereof was 0.552 (W/m·K).

In carrying out the measurement, two of the substrates were piled to be 3.2 mm in thickness in total far the purpose of making the thickness of the measuring object in the comparative example 1 equal to that in Embodiment 6 described above. Further, in order to ensure the insulation property of the measuring object, the surface of the insulated substrate, from which the copper foil is removed, was overlaid with a wrap file (10 μm in thickness) by way of precaution. Incidentally, although the epoxy/glass substrate need not take such a measure for ensuring the insulation property because it is intact an insulator, the epoxy/glass substrate to be measured experimentally was wrapped with the wrap film to maintain all the measuring condition.

It was found from the result of the measurement that the board according to Embodiment 6 of the invention is remarkably improved in its heat conductivity, that is, the board of the invention, which has heat conductivity of 22.64 (W/m·K), is considerably higher than the substrate of the comparative example, which has heat conductivity of 0.552 (W/m·K).

The metal-clad laminated board for the printed wiring board according to the present invention comprises the strongly united carbon-base substrate and metal foil and excels in various characteristics such as volume resistance, surface resistance, and relative dielectric constant, dielectric loss tangent. These excellent characteristics of the printed wiring board of the invention satisfies the standard values of the conventional metal-clad circuit boards of this type. Thus, the printed wiring board of the invention could be effectively applied for the required purposes. The devices used in the measurements described above are shown in Table 1, and the measuring results are shown in Table 2.

TABLE 1

| Test Item | Testing Device | Maker | Model Name | Remarks |
| --- | --- | --- | --- | --- |
| Insulation Resistance | Insulation Resistance | Hewlett Packeard Co. | HP4329A HIGH RESISTANCE METER | Amplifier |
| Surface Resistance | Measuring Device | Yokokawa Hewlett | YHP 16008 RESISTIVIT CELL | Electrode |
| Volume Resistance | | Packeard Co. | | |
| Dielectric Constant | Dielectric Constant | Hewlett Packeard Co. | HP4194A INPEDANCE GAIN-PHASE | Measuring |
| Dielectric Loss Tangent | Measuring Device | | ANALYZER | Device |
| | | | HP4194A MEASURMENT UNIT | Units |
| | | | HP1645B DIELECTRIC TEST FIXTURE | Electrode |
| Breakdown Strength | High-voltage Breakdown | Kikusui Electronics | TOS 8700 WITHSTANDING VOLTAGE | Measured Up |
| Dielectric Strength | Measuring Device | Corporation | TESTER | to 10 kV |
| Heat Conductivity | Heat Conductivity | Kyoto Electronics | QTM-500 | |
| | Measuring Device | Corporation | | |

TABLE 2

| Item | Treating Conditions | Embodiment 6 | Comparative Example 1 | Value in JIS Code | Remarks |
| --- | --- | --- | --- | --- | --- |
| Volume Resistance (Ω · cm) | C-96/20/65[*1] | $4.60 \times 10^{14}$ | $1 \times 10^{13} \sim 1 \times 10^{14}$ | $1 \times 10^{12}$ | JIS C6481 |
| Surface Resistance(Ω) | C-96/20/65 | $3.58 \times 10^{12}$ | $1 \times 10^{11} \sim 1 \times 10^{12}$ | $1 \times 10^{11}$ | JIS C6481 |
| Relative Dieletric Constant (1 MHz) | C-96/20/65 | 2.1 | 4.1~4.6 | Below 5.5 | JIS C6481 |
| Dielelectric Loss Tangent (1 MHz) | C-96/20/65 | 0.005 | 0.03~0.04 | Below 0.045 | JIS C6481 |
| Breakdown Strength[*5] (kV) | C-96/20/65 (6 = 0.11 mm) | 8.2 | — | — | JIS K6911 |
| Peeling Strength (N/cm) | A[*2] | 92.4 | 18.6~23.5 | Over 10.8 (over 1.1 kgf/cm) | JIS C6481 |
| | E-1/150[*3] | 12.7 | 9.8~11.8 | Over 15.7 (over 1.6 kgf/cm) | JIS C6481 |
| | After soldering[*4] | 18.8 | 18.6~23.5 | Over 15.7 (over 1.6 kgf/cm) | JIS C6481 |
| Heat Resistance | Solder[*4] | O.K | O.K | No bulge and break acceptable | JIS C6481 |
| | 200° C., 60 min. | O.K | O.K | No bulge and break acceptable | JIS C6481 |
| Heat Conductivity (W/m · K) | | 22.64 | 0.552 | — | JIS R2618 |

[*1]In air of constant temperature and constant humidity at 20° C. and 65% RH for 96 hours)
[*2]Normal State
[*3]In air of constant temperature at 150° C. for 1 hour
[*4]At 260° C. for 20 seconds
[*5]Continuous Pressor Testing

Embodiment 7

As an alternative to the copper foil used in Embodiment 1 described above, a lead frame formed by punching a copper plate of 500 μm thickness was used. The other conditions for producing a lead frame laminated board for this embodiment were common to Embodiment 1. The lead frame laminated board resultantly obtained was processed in the same manner as that in Embodiment 6, that is, etched to remove the lead frame being a substitute for the copper foil in the former embodiments. The board having no lead frame was measured in heat conductivity. It was found from the result of the measurement that the board of this embodiment is remarkably higher in heat conductivity than that of Embodiment 1, similarly to the board of Embodiment 6.

Embodiment 8

Onto one surface of a plate-like C/C composite having 3 mm thickness same as that used in Embodiment 1 noted above, UPIREX-S (trade name of Ube Industries, Ltd., as which polyimide varnish is designated) was applied with a brush, and then, UPITITE (trade name of Ube Industries, Ltd.) of 20 μm thickness, which is a film type polyimide bonding agent, was placed. Further, the composite was overlaid with a copper foil of 70 μm thickness, pressed at 170° C. for 30 minutes at the pressure of 294N/cm², consequently to obtain the copper-clad laminated board. The copper-clad board thus obtained was measure in heat conductivity in the same manner as Embodiment 6. It was found from the result of the measurement that the copper-clad board produced in this embodiment has high heat conductivity, similarly to that obtained in the foregoing embodiments. On conducting a peeling test defined by JIS C6481, the board produced in this embodiment exhibited as high as 1.2 kgf/cm in peeling strength.

Embodiment 9

Onto one surface of a plate-like C/C composite having 3 mm thickness same as that used in Embodiment 1 noted above, a copper foil of 70 μm thickness was applied through UPITITE (Products No. UPA-N111: trade name of Ube Industries, Ltd.) of 20 μm thickness, which is a film type polyimide bonding agent, and pressed at 250° C. for 3 minutes at 50N/cm², to obtain a copper-clad laminated board. The copper-clad board thus obtained was measure in heat conductivity in the same manner as Embodiment 6. It was found from the result of the measurement that the copper-clad board produced in this embodiment has high heat conductivity. On conducting a peeling test defined by JIS C6481, the board produced in this embodiment exhibited as high as 1.1 kgf/cm in peeling strength.

Embodiment 10

As an alternative to the electrodeposition polyimide coating membrane used in Embodiment 1 described above, a polyimide-vaporized polymer layer formed in a vacuum was used. The other conditions for producing a copper-clad laminated board for this embodiment were common to Embodiment 1. The thickness of the polyimide-vaporized polymer layer on the copper-clad laminated board obtained in this embodiment was 20 μm. Upon removing the copper foil from the board, the measurement of heat conductivity was carried out in the same manner as Embodiment 6. It was found from the result of the measurement that the board of this embodiment is remarkably higher in heat conductivity than that of Embodiment 1, similarly to the board of Embodiment 6.

Embodiment 11

A polyimide coating membrane was formed on one surface of a platelike C/C composite having 3 mm thickness same as that used in Embodiment 1 noted above by applying polyimide coating material of RIKACOAT PN-20 (trade name of New Japan Chemical Co. Ltd.) with a brush and baked at 200° C. for 30 minutes, thereby to form a polyimide coating membrane of 20 μm thickness. The polyimide coating membrane thus formed was overlaid with metal-aramid paper of 120 μm thickness impregnated with silicone bonding agent, i.e. KE1800T (trade name of Shin-Etsu Silicones Co. Ltd.) and further overlaid with a copper foil of 70 μm thickness. Before applying the polyimide coating membrane and bonding agent, PRIMER-A (trade name of Dow-Corning Toray Silicone Co. Ltd) was preliminarily applied to the copper foil with a brush in a primer applying process. Subsequently, the laminated board thus obtained was pressed at 294N/cm² for 3 minutes by a heat press to remove air and surplus bonding agent, and then, after releasing the pressure exerted thereon, subjected to heating treatment at 120° C. for 60 minutes to harden the bonding agent. Thus, the copper-clad laminated board was prepared Thereafter, upon removing the copper foil from the board, the measurement of heat conductivity was carried out in the same manner as Embodiment 6. It was found from the result of the measurement that the board of this embodiment is remarkably higher in heat conductivity than that of Embodiment 1, similarly to the board of Embodiment 6. On conducting an electrical breakdown test defined by JIS K6911, the board produced in this embodiment exhibited as high as 10.8 kV in breakdown strength.

INDUSTRIAL APPLICABILITY:

According to the present invention, there is provided a printed wring board capable of dissipating heat and superior in thermal conduction, which is formed in a metal-clad or lead frame lamination. The printed wiring board according to the invention has the carbon-base substrate and metal foil or lead frame united firmly therewith.

The printed wiring board can be produced at a low cost because the raw material of the carbon-base substrate is inexpensive. The printed wiring board is light because of a light the carbon-base substrate, so that electric or electronic apparatuses using the printed wiring board can be lightened.

What is claimed is:

1. A printed wiring board comprising:
   - a carbon-base substrate which comprises carbonaceous material impregnated with an inorganic coating agent or metal so as to fill up pores in said carbon-base substrate,
   - at least one insulating bonding layer of a polyimide coating membrane on said carbon-base substrate and a bonding agent layer on said polyimide coating membrane, and
   - a metal foil or lead frame on said at least one insulating bonding layer.

2. A printed wiring board set forth in claim 1, comprising said metal foil, said carbon-base substrate and said insulating bonding layer to form a metal-clad laminated board.

3. A printed wiring board set forth in claim 1, comprising said lead frame, said carbon-base substrate and said insulating bonding layer to form a lead frame laminated board.

4. A printed wiring board set forth in claim 1, wherein said polyimide coating membrane is an electrodeposition polyimide coating membrane.

5. A printed wiring board set forth in claim 1, wherein an insulating woven or nonwoven fabric is embedded in said bonding agent layer.

6. A printed wiring board set forth in claim 2, wherein an insulating woven or nonwoven fabric is embedded in said bonding agent layer.

7. A printed wiring board set forth in claim 3, wherein an insulating woven or nonwoven fabric is embedded in said bonding agent layer.

8. A printed wiring board set forth in claim 4, wherein an insulating woven or nonwoven fabric is embedded in said bonding agent layer.

9. A printed wiring board set forth in claim 1, wherein said bonding agent layer contains filler serving as a spacer.

10. A printed wiring board set forth in claim 2, wherein said bonding agent layer contains filler serving as a spacer.

11. A printed wiring board set forth in claim 3, wherein said bonding agent layer contains filler serving as a spacer.

12. A printed wiring board set forth in claim 4, wherein said bonding agent layer contains filler serving as a spacer.

* * * * *